(12) United States Patent
Yakura et al.

(10) Patent No.: US 8,436,974 B2
(45) Date of Patent: May 7, 2013

(54) ILLUMINATING DEVICE AND LIQUID CRYSTAL DISPLAY DEVICE PROVIDED WITH THE SAME

(75) Inventors: Hirohisa Yakura, Osaka (JP); Tetsuya Hamada, Osaka (JP)

(73) Assignee: Sharp Kabsuhiki Kaisha, Osaka (JP)

( * ) Notice: Subject to any disclaimer, the term of this patent is extended or adjusted under 35 U.S.C. 154(b) by 237 days.

(21) Appl. No.: 13/003,789

(22) PCT Filed: Jun. 3, 2009

(86) PCT No.: PCT/JP2009/060144
§ 371 (c)(1),
(2), (4) Date: Jan. 12, 2011

(87) PCT Pub. No.: WO2010/016321
PCT Pub. Date: Feb. 11, 2010

(65) Prior Publication Data
US 2011/0116015 A1 May 19, 2011

(30) Foreign Application Priority Data
Aug. 8, 2008 (JP) ................. 2008-205126

(51) Int. Cl.
*G02F 1/1345* (2006.01)
*G02F 1/13357* (2006.01)
*G02F 1/1335* (2006.01)
*F21V 7/22* (2006.01)

(52) U.S. Cl.
USPC .............................. 349/150; 362/606; 349/62

(58) Field of Classification Search .......... 349/147–150, 349/62; 362/606, 612
See application file for complete search history.

(56) References Cited

U.S. PATENT DOCUMENTS

| 4,197,586 | A * | 4/1980 | Nidiffer | 361/679.09 |
| 2008/0248258 | A1* | 10/2008 | Hao | 428/172 |
| 2010/0252307 | A1* | 10/2010 | Mo | 174/254 |
| 2011/0009168 | A1* | 1/2011 | Lai | 455/558 |
| 2011/0025949 | A1* | 2/2011 | Park | 349/64 |
| 2012/0176761 | A1* | 7/2012 | Lee | 361/807 |

FOREIGN PATENT DOCUMENTS

| JP | 2005-135862 A | 5/2005 |
| JP | 2005-235560 A | 9/2005 |
| JP | 2007-128822 A | 5/2007 |
| JP | 2007-234412 A | 9/2007 |

OTHER PUBLICATIONS

Official Communication issued in International Patent Application No. PCT/JP2009/060144, mailed on Sep. 8, 2009.

* cited by examiner

*Primary Examiner* — Akm Enayet Ullah
(74) *Attorney, Agent, or Firm* — Keating & Bennett, LLP

(57) ABSTRACT

Provided is an illuminating device wherein generation of luminance nonuniformity is suppressed, while suppressing deterioration of light use efficiency. An illuminating device (10) is provided with an FPC (8), which has at least a part (8a) perpendicularly arranged to a light incoming surface (3a) of a light guide plate (3) and has an LED (7) mounted on the part (8a). The FPC (8) is also provided with a part (8b) positioned below a region between the LED (7) and the light incoming surface (3a), and the part (8b) is tilted in a diagonally downward direction toward the light incoming surface (3a).

12 Claims, 4 Drawing Sheets

ILLUMINATING DEVICE AND LIQUID CRYSTAL DISPLAY DEVICE PROVIDED WITH THE SAME

TECHNICAL FIELD

The present invention relates to an illuminating device and a liquid crystal display device provided with the same.

BACKGROUND ART

Conventionally, an illuminating device that can output planar light has been known and used as a backlight unit for illuminating a liquid crystal display panel of a liquid crystal display device. As such an illuminating device for use in a liquid crystal display device, there exist illuminating devices of a direct type, a sidelight type, etc.

The direct type illuminating device has a configuration in which a light source is disposed immediately below a liquid crystal display panel. On the other hand, the sidelight type illuminating device has a configuration in which a light guide plate is disposed immediately below a liquid crystal display panel, and a light source is disposed in an opposed manner to a predetermined side end surface of the light guide plate (see, for example, Patent Document 1). In the sidelight type illuminating device, light emitted from the light source is introduced into the light guide plate via the predetermined side end surface of the light guide plate. The light thus introduced into the light guide plate is converted into planar light, and the liquid crystal display panel is illuminated with the planar light.

FIG. 4 is a simplified diagram of an example of a sidelight type illuminating device according to the conventional technique. With reference to FIG. 4, the conventional sidelight type illuminating device uses a plurality of light-emitting diode elements (LED) 101 as a light source. The plurality of LEDs 101 as the light source are mounted on a flexible printed circuit board 102 and arranged at a predetermined spacing from each other.

Furthermore, a light guide plate 103 that converts light from the LEDs 101 into planar light is made of a transparent plate-shaped member and has four side end surfaces as well as a front surface and a back surface that are perpendicular to the four side end surfaces. A predetermined one of the four side end surfaces of the light guide plate 103 is a surface to which the LEDs 101 are disposed in an opposed manner and functions as a light incidence surface for introducing light from the LEDs 101 into the light guide plate 103. Furthermore, the front surface of the light guide plate 103 is a surface that faces the side of a liquid crystal display panel (not shown) and functions as a light output surface for outputting in a planar shape, light introduced into the light guide plate 103 toward the side of the liquid crystal display panel.

According to the conventional technique, in order to allow effective incidence of light from the LEDs 101 on the light incidence surface of the light guide plate 103, the respective light-emitting surfaces of the LEDs 101 are located in close contact with the light incidence surface of the light guide plate 103. Furthermore, the LEDs 101 are fixed by a method in which part of the FPC 102 on which the LEDs 101 are mounted is bonded to the back surface of the light guide plate 103 using a double-sided adhesive tape (not shown).

Prior Art Document
Patent Document
Patent Document 1: JP-A-2005-235560

DISCLOSURE OF THE INVENTION

Problems to be Solved by the Invention

In the conventional configuration shown in FIG. 4, if the number of the LEDs 101 used is reduced for the purpose of, for example, cost reduction, a trouble may arise that luminance variations (eyeball-shaped luminance variations) occur in an end portion region of the light guide plate 103 on the side of the LEDs 101. For example, if the number of the LEDs 101 used is reduced from a state shown in FIG. 5 to a state shown in FIG. 6, a portion 110 corresponding to the space between each pair of adjacent ones of the LEDs 101 becomes dim and thus leads to the occurrence of luminance variations (eyeball-shaped luminance variations). Also, in the conventional configuration shown in FIG. 4, in addition to the luminance variations (eyeball-shaped luminance variations) in the end portion region of the light guide plate 103 on the side of the LEDs 101, there may arise another trouble that band-shaped luminance variations occur over the entire surface.

One possible solution to the above-described troubles is to increase the spacing between the LEDs 101 and the light incidence surface of the light guide plate 103.

In the conventional configuration shown in FIG. 4, however, if the spacing between the LEDs 101 and the light incidence surface of the light guide plate 103 is increased, while the occurrence of luminance variations can be suppressed, it becomes difficult to allow effective incidence of light from the LEDs 101 on the light incidence surface of the light guide plate 103. This leads to still another trouble that light use efficiency is deteriorated.

Furthermore, in the conventional configuration shown in FIG. 4, in the end portion region of the light guide plate 103 on the side of the LEDs 101, light is transmitted through the double-sided adhesive tape (not shown) between the FPC 102 and the light guide plate 103 and then is absorbed by the FPC 102. This further deteriorates light use efficiency.

In order to solve the above-described problems, it is an object of this invention to provide an illuminating device that can suppress the occurrence of luminance variations while preventing the deterioration of light use efficiency, and a liquid crystal display device provided with the same.

Means for Solving the Problem

In order to achieve the above-described object, an illuminating device according to a first aspect of this invention includes: a plurality of light-emitting diode elements that are arranged at a predetermined spacing from each other; a light guide plate that has at least a light incidence surface to which the light-emitting diode elements are disposed in an opposed manner and a light output surface that is perpendicular to the light incidence surface and faces the side of an illuminated body; and a flexible printed circuit board that includes at least a first portion disposed perpendicularly to the light incidence surface of the light guide plate, where the light-emitting diode elements are mounted on the first portion. The flexible printed circuit board further includes, in addition to the first portion, a second portion positioned below a region between the light-emitting diode elements and the light incidence surface of the light guide plate. The second portion of the flexible printed circuit board is formed so as to be inclined in an obliquely downward direction toward the light incidence surface of the light guide plate and to reflect light from the light-emitting diode elements toward the light incidence surface of the light guide plate.

In this illuminating device according to the first aspect, as described above, the second portion (portion that is formed so as to be inclined in the obliquely downward direction toward the light incidence surface of the light guide plate and to reflect light from the light-emitting diode elements toward the light incidence surface of the light guide plate) of the flexible printed circuit board is disposed below the region between the light-emitting diode elements and the light incidence surface of the light guide plate. By this configuration, light traveling toward below the region between the light-emitting diode elements and the light incidence surface of the light guide plate (light not traveling toward the light incidence surface of the light guide plate) can be reflected toward the light incidence surface of the light guide plate. Thus, in a case where the spacing between the light-emitting diode elements and the light incidence surface of the light guide plate is increased, even if the amount of light traveling toward below the region between the light-emitting diode elements and the light incidence surface of the light guide plate (light not traveling toward the light incidence surface of the light guide plate) is increased, such light can be made incident on the light incidence surface of the light guide plate. This makes it possible to increase the spacing between the light-emitting diode elements and the light incidence surface of the light guide plate while preventing the deterioration of light use efficiency. As a result, even in a case where the spacing between the light-emitting diode elements and the light incidence surface of the light guide plate is increased for the purpose of suppressing the occurrence of luminance variations, the deterioration of light use efficiency can be prevented.

Based on the above, in this illuminating device according to the first aspect, even if the number of the light-emitting diode elements used is reduced, it is possible to suppress the occurrence of luminance variations (eyeball-shaped luminance variations) in the end portion region of the light guide plate on the side of the light-emitting diode elements while preventing the deterioration of light use efficiency. This can reduce the cost of the light-emitting diode elements. Moreover, the temperature rise of the light-emitting diode elements is suppressed, and thus the light emission efficiency of the light-emitting diode elements can be improved.

In the above-described illuminating device according to the first aspect, preferably, a reflection sheet further is provided that is disposed on the side of a back surface of the light guide plate opposite to the side of the light output surface, and an end portion of the reflection sheet on the side of the light-emitting diode elements extends to over the second portion of the flexible printed circuit board and is affixed onto the second portion of the flexible printed circuit board. According to this configuration, the second portion of the flexible printed circuit board is enabled to act as a light reflection portion having a high light reflectance, and thus the amount of light entering the light incidence surface of the light guide plate is further increased, so that light use efficiency can be further improved.

In the above-described illuminating device according to the first aspect, preferably, the inclination angle of the second portion with respect to the first portion of the flexible printed circuit board is set so that the light-emitting diode elements mounted on the first portion of the flexible printed circuit board are located closely to the center of the light guide plate in the thickness direction. According to this configuration, the occurrence of band-shaped luminance variations over the entire surface can be further suppressed.

In the above-described illuminating device according to the first aspect, preferably, the second portion of the flexible printed circuit board is a wiring region.

In the above-described illuminating device according to the first aspect, preferably, a dot pattern is formed on a back surface of the light guide plate on the side opposite to the light output surface. Further, the second portion of the flexible printed circuit board is not bonded to an end portion region of the back surface of the light guide plate on the side of the light-emitting diode elements, and a region in which the dot pattern is formed extends over the entire area of the back surface of the light guide plate. According to this configuration, loss of light in the end portion region of the light guide plate on the side of the light-emitting diode elements can be reduced.

In the above-described illuminating device according to the first aspect, preferably, a light reflection portion for reflecting light from the light-emitting diode elements toward the light incidence surface of the light guide plate is provided above the region between the light-emitting diode elements and the light incidence surface of the light guide plate. According to this configuration, in addition to light traveling toward below the region between the light-emitting diode elements and the light incidence surface of the light guide plate (light not traveling toward the light incidence surface of the light guide plate), light traveling toward above the region between the light-emitting diode elements and the light incidence surface of the light guide plate (light not traveling toward the light incidence surface of the light guide plate) can also be reflected toward the light incidence surface of the light guide plate. Thus, the amount of light entering the light incidence surface of the light guide plate is further increased, and thus light use efficiency can be further improved.

A liquid crystal display device according to a second aspect of this invention includes the above-described illuminating device according to the first aspect and a liquid crystal display panel that is irradiated with light from the illuminating device. According to this configuration, it is easily achievable to suppress the occurrence of luminance variations while preventing the deterioration of light use efficiency.

Advantages of the Invention

As described thus far, according to the present invention, it is easily achievable to obtain an illuminating device that can suppress the occurrence of luminance variations while preventing the deterioration of light use efficiency, and a liquid crystal display device provided with the same.

BEST MODE FOR CARRYING OUT THE INVENTION

Figure 1:
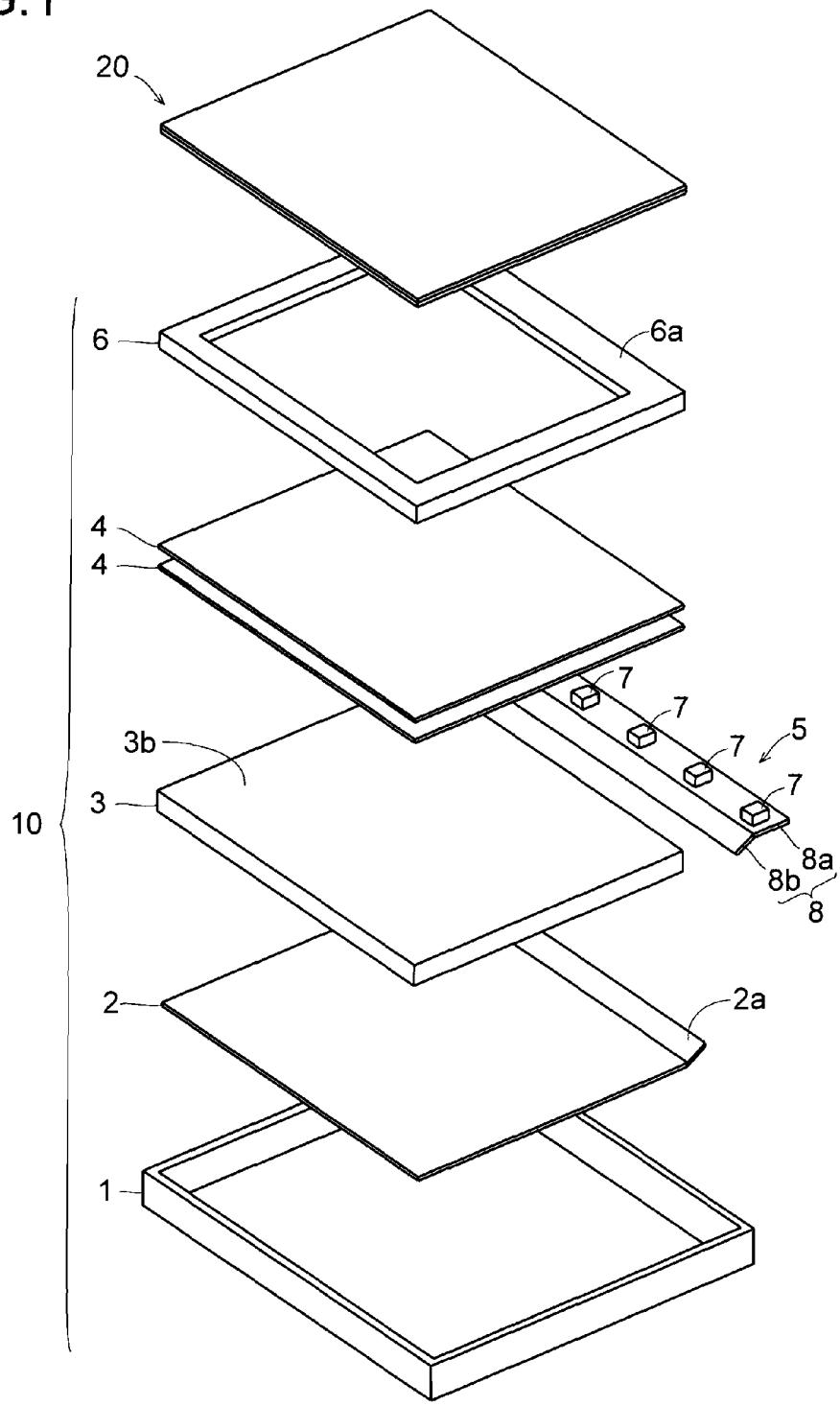
[FIG. 1] An exploded perspective view of an illuminating device according to an embodiment of the present invention.
Figure 2:
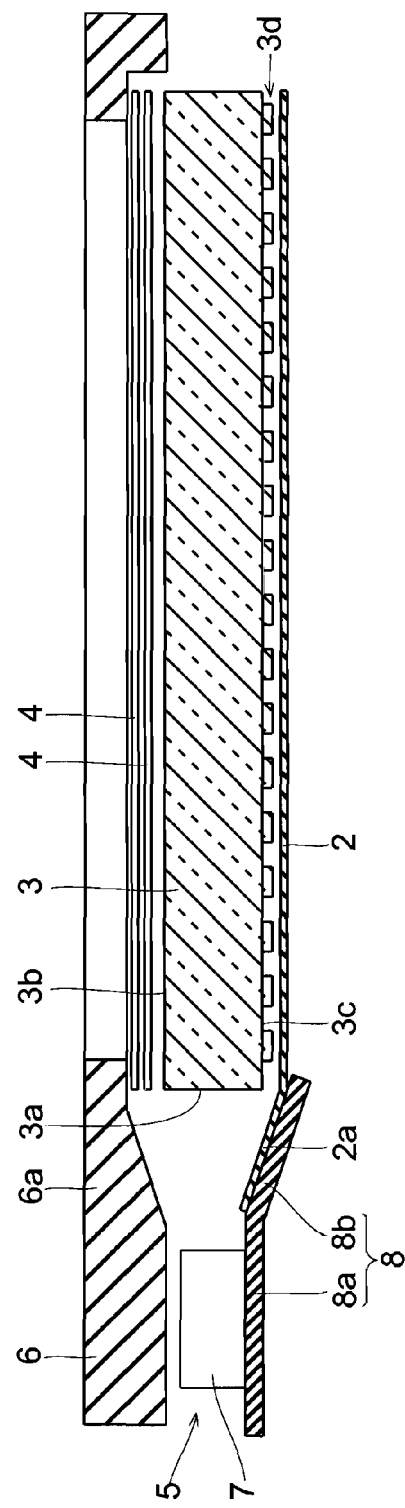
[FIG. 2] A cross-sectional view of the illuminating device according to the embodiment shown in FIG. 1.

Hereinafter, an illuminating device 10 according to the present embodiment will be described with reference to FIGS. 1 and 2.

The illuminating device 10 according to the present embodiment is used as a backlight unit installed in a liquid crystal display device and is configured to generate planar light and to irradiate a liquid crystal display panel (illuminated body) 20 with the generated light from a back surface side of the liquid crystal display panel 20. The illuminating device 10 according to the present embodiment is installed in, for example, a liquid crystal display device for commercial use.

Furthermore, the illuminating device 10 is of the sidelight type and includes at least a back case 1, a reflection sheet 2, a light guide plate 3, optical sheets 4, a light source module 5, and a frame 6. The illuminating device 10 is structured by mounting the reflection sheet 2, the light guide plate 3, the optical sheets 4, the light source module 5, and the frame 6 into the back case 1.

The back case 1 is made of sheet metal, a resin molded article, or the like and formed in the shape of a box having an opening on the side of the liquid crystal display panel 20. That is, the back case 1 includes a quadrangular bottom portion and four side portions provided in a standing manner at the outer periphery of the bottom portion. A region on the bottom portion of the back case 1, which is surrounded by the four side portions, is used as a housing space.

The reflection sheet 2 is disposed on the bottom portion of the back case 1 and covers a back surface 3c of the light guide plate 3, which will be described later. Since the reflection sheet 2 as described above is provided, even if light leaks from the back surface 3c of the light guide plate 3, such light is reflected by the reflection sheet 2, and thus light that has leaked from the back surface 3c of the light guide plate 3 can be introduced again into the light guide plate 3.

The light guide plate 3 is intended to guide light from light-emitting diode elements (LED) 7, which will be described later, and is disposed on the reflection sheet 2. The light guide plate 3 is made of a transparent resinous plate-shaped member, and has four side end surfaces including a side end surface 3a to which the LEDs 7 are disposed in an opposed manner as well as a front surface 3b and the back surface 3c that are continuous with the four side end surfaces. The side end surface 3a of the light guide plate 3 functions as a light incidence surface for introducing light from the LEDs 7 into the light guide plate 3. Furthermore, the front surface 3b of the light guide plate 3 is a surface that is perpendicular to the light incidence surface 3a of the light guide plate 3 and faces the side of the liquid crystal display panel 20. The front surface 3b of the light guide plate 3 functions as a light output surface for outputting in a planar shape, light introduced into the light guide plate 3 in a direction toward the side of the liquid crystal display panel 20. In the following description, the side end surface 3a of the light guide plate 3 is referred to as the light incidence surface 3a, and the front surface 3b of the light guide plate 3 is referred to as the light output surface 3b.

Furthermore, the back surface 3c of the light guide plate 3 is a surface that is perpendicular to the light incidence surface 3a of the light guide plate 3 and positioned on the side of the light guide plate 3 opposite to the light output surface 3b. A dot pattern (concavo-convex pattern) 3d made up of a plurality of minute concave and convex portions is formed on the back surface 3c of the light guide plate 3. The dot pattern 3d of the light guide plate 3 is intended to change the traveling direction of light introduced into the light guide plate 3 so that the light introduced into the light guide plate 3 is outputted effectively from the light output surface 3b of the light guide plate 3 in the direction toward the side of the liquid crystal display panel 20.

The optical sheets 4 include a diffusion sheet, a prism sheet, and the like and are disposed on the light output surface 3b of the light guide plate 3. By use of the optical sheets 4, light outputted from the light output surface 3b of the light guide plate 3 is, for example, diffused and condensed.

The light source module 5 includes a plurality of the LEDs 7, a flexible printed circuit board (FPC) 8 on which the plurality of the LEDs 7 are mounted, and the like. The plurality of the LEDs 7 are arranged at a predetermined spacing from each other in a direction along the light incidence surface 3a of the light guide plate 3 so that each of the LEDs 7 is opposed to the light incidence surface 3a of the light guide plate 3.

Furthermore, the FPC 8 includes at least a portion ("first portion" of the present invention) 8a disposed perpendicularly to the light incidence surface 3a of the light guide plate 3. The LEDs 7 are mounted on the portion 8a of the FPC 8. The FPC 8 further includes, in addition to the portion 8a on which the LEDs 7 are mounted, a portion ("second portion" of the present invention) 8b in which a wiring region is provided.

Here, in the present embodiment, the spacing between the LEDs 7 and the light incidence surface 3a of the light guide plate 3 is maintained at such a distance from each other as to be able to suppress the occurrence of luminance variations. Further, a light reflection portion for reflecting light from the LEDs 7 toward the light incidence surface 3a of the light guide plate 3 is provided below a region (space) between the LEDs 7 and the light incidence surface 3a of the light guide plate 3.

Specifically, in this structure, the portion 8b of the FPC 8, which is used as the wiring region, is positioned on a side closer to the light incidence surface 3a of the light guide plate 3 relative to the portion 8a of the FPC 8, which is used as a mounting region, and the portion 8b of the FPC 8 is inclined in an obliquely downward direction toward the light incidence surface 3a of the light guide plate 3. Accordingly, the inclined portion 8b of the FPC 8 is positioned below the region (space) between the LEDs 7 and the light incidence surface 3a of the light guide plate 3.

Moreover, an end portion 2a of the reflection sheet 2 on the side of the LEDs 7 extends to over the portion (portion that is positioned below the region (space) between the LEDs 7 and the light incidence surface 3a of the light guide plate 3 and inclined in the obliquely downward direction toward the light incidence surface 3a of the light guide plate 3) 8b of the FPC 8, and the end portion 2a of the reflection sheet 2 on the side of the LED 7 is affixed onto the portion 8b of the FPC 8. This enables the portion 8b of the FPC 8 to function as the light reflection portion, and thus light from the LEDs 7 can be reflected toward the light incidence surface 3a of the light guide plate 3, below the region (space) between the LEDs 7 and the light incidence surface 3a of the light guide plate 3.

Furthermore, in the present embodiment, the portions 8a and 8b of the FPC 8 are integrally connected and a boundary portion between the portions 8a and 8b of the FPC 8 is bent so that the portion 8b of the FPC 8 is inclined in the obliquely downward direction toward the light incidence surface 3a of the light guide plate 3. The inclination angle of the portion 8b with respect to the portion 8a of the FPC 8 is set so that the LEDs 7 mounted on the portion 8*a* of the FPC 8 are located closely to the center of the light guide plate 3 in the thickness direction.

The portion 8*b* of the FPC 8 is not bonded to an end portion region of the back surface 3*c* of the light guide plate 3 on the side of the LEDs 7. That is, the end portion region of the back surface 3*c* of the light guide plate 3 on the side of the LEDs 7 is left as an open space. In the present embodiment, the dot pattern 3*d*, therefore, is formed over the entire area of the back surface 3*c* of the light guide plate 3 including the open space.

The frame 6 is made of white plastic molded into a frame and attached to the opening of the back case 1. The optical sheets 4 are held down from above at their outer peripheries by a frame portion of the frame 6.

Furthermore, part of a frame portion 6*a* of the frame 6 on the side of the LEDs 7 is formed so as to be inclined in an upward oblique direction toward the light incidence surface 3*a* of the light guide plate 3. This inclined portion of the frame portion 6*a* of the frame 6 is positioned above the region (space) between the LEDs 7 and the light incidence surface 3*a* of the light guide plate 3, and functions as a light reflection portion for reflecting light from the LEDs 7 toward the light incidence surface 3*a* of the light guide plate 3, above the region (space) between the LEDs 7 and the light incidence surface 3*a* of the light guide plate 3. That is, in the present embodiment, there is provided the light reflection portion above the region (space) between the LEDs 7 and the light incidence surface 3*a* of the light guide plate 3.

In the present embodiment, as described in the foregoing, the portion (portion that is formed so as to be inclined in the obliquely downward direction toward the light incidence surface 3*a* of the light guide plate 3 and to reflect light from the LEDs 7 toward the light incidence surface 3*a* of the light guide plate 3) 8*b* of the FPC 8 is disposed below the region (space) between the LEDs 7 and the light incidence surface 3*a* of the light guide plate 3. By this configuration, light traveling toward below the region (space) between the LEDs 7 and the light incidence surface 3*a* of the light guide plate 3 (light not traveling toward the light incidence surface 3*a* of the light guide plate 3) can be reflected toward the light incidence surface 3*a* of the light guide plate 3. Thus, in a case where the spacing between the LEDs 7 and the light incidence surface 3*a* of the light guide plate 3 is increased, even if the amount of light traveling toward below the region (space) between the LEDs 7 and the light incidence surface 3*a* of the light guide plate 3 (light not traveling toward the light incidence surface 3*a* of the light guide plate 3) is increased, such light can be made incident on the light incidence surface 3*a* of the light guide plate 3. This makes it possible to increase the spacing between the LEDs 7 and the light incidence surface 3*a* of the light guide plate 3 while preventing the deterioration of light use efficiency. As a result, even in a case where the spacing between the LEDs 7 and the light incidence surface 3*a* of the light guide plate 3 is increased for the purpose of suppressing the occurrence of luminance variations, the deterioration of light use efficiency can be prevented.

Figure 3:
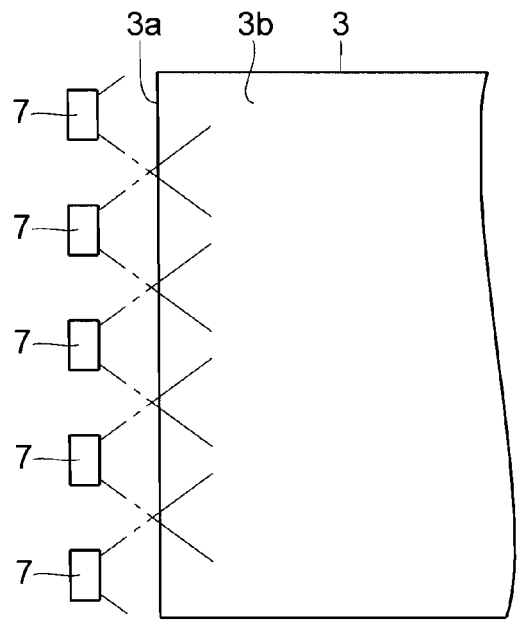
[FIG. 3] A diagram for explaining effects of the present invention.
Figure 4:
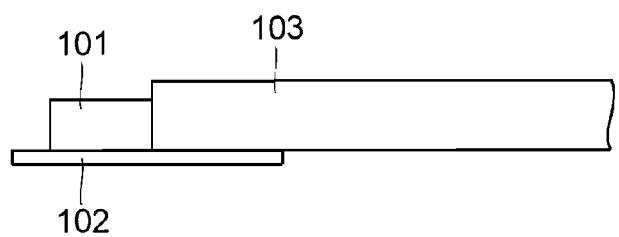
[FIG. 4] A simplified diagram of an example of a sidelight type illuminating device according to the conventional technique.
Figure 5:
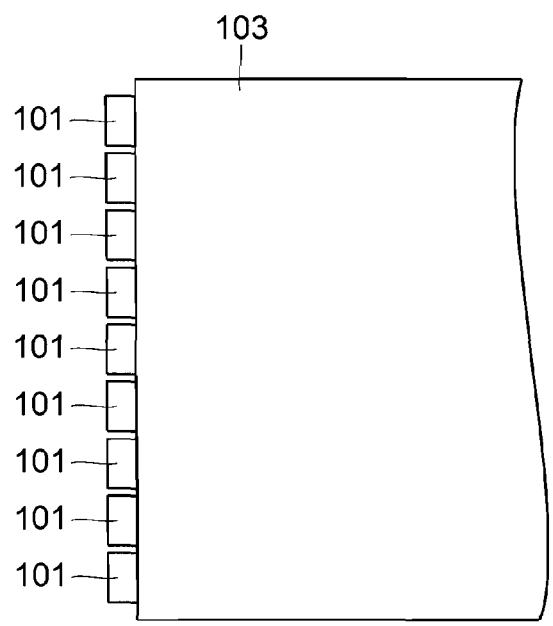
[FIG. 5] A diagram for explaining problems with the conventional technique.
Figure 6:
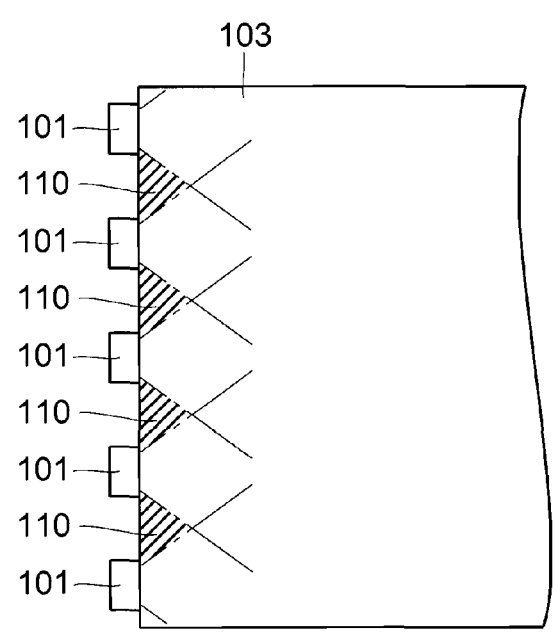
[FIG. 6] A diagram for explaining the problems with the conventional technique.

Based on the foregoing, in the present embodiment, even if the number of the LEDs 7 used is reduced, it is possible to suppress the occurrence of luminance variations (eyeball-shaped luminance variations) in an end portion region of the light guide plate 3 on the side of the LEDs 7 while preventing the deterioration of light use efficiency. That is, as shown in FIG. 3, even if the number of the LEDs 7 used is reduced, increasing the spacing between the LEDs 7 and the light incidence surface 3*a* of the light guide plate 3 causes color mixing of light from each pair of adjacent ones of the LEDs 7 in the vicinity of the light incidence surface 3*a* of the light guide plate 3, and thus, consequently, the occurrence of luminance variations (eyeball-shaped luminance variations) in the end portion region of the light guide plate 3 on the side of the LEDs 7 can be suppressed. This can reduce the cost of the LEDs 7. Moreover, the temperature rise of the LEDs 7 is suppressed, and thus the light emission efficiency of the LEDs 7 can be improved.

Furthermore, in the present embodiment, as described in the foregoing, the end portion 2*a* of the reflection sheet 2 on the side of the LEDs 7 is made to extend to over the portion 8*b* of the FPC 8 and is affixed onto the portion 8*b* of the FPC 8. This enables the portion 8*b* of the FPC 8 to act as the light reflection portion having a high light reflectance, and thus the amount of light entering the light incidence surface 3*a* of the light guide plate 3 is further increased, so that light use efficiency can be further improved.

Furthermore, in the present embodiment, as described in the foregoing, the inclination angle of the portion 8*b* with respect to the portion 8*a* of the FPC 8 is set so that the LEDs 7 mounted on the portion 8*a* of the FPC 8 are located closely to the center of the light guide plate 3 in the thickness direction, and thus the occurrence of band-shaped luminance variations over the entire surface can be further suppressed.

Furthermore, in the present embodiment, as described in the foregoing, the portion 8*b* of the FPC 8 is not bonded to the end portion region of the back surface 3*c* of the light guide plate 3 on the side of the LEDs 7, and the dot pattern 3*d* is formed over the entire area of the back surface 3*c* of the light guide plate 3, so that loss of light in the end portion region of the light guide plate 3 on the side of the LEDs 7 can be reduced.

Furthermore, in the present embodiment, as described in the foregoing, part of the frame portion 6*a* of the frame 6 made of white plastic, which is on the side of the LEDs 7, is inclined in the upward oblique direction toward the light incidence surface 3*a* of the light guide plate 3, and this inclined portion of the frame portion 6*a* of the frame 6 is disposed above the region (space) between the LEDs 7 and the light incidence surface 3*a* of the light guide plate 3. By this configuration, in addition to light traveling toward below the region (space) between the LEDs 7 and the light incidence surface 3*a* of the light guide plate 3, light traveling toward above the region (space) between the LEDs 7 and the light incidence surface 3*a* of the light guide plate 3 can also be reflected toward the light incidence surface 3*a* of the light guide plate 3. Thus, the amount of light entering the light incidence surface 3*a* of the light guide plate 3 is further increased, and thus light use efficiency can be further improved.

The embodiment disclosed in this application is to be considered in all respects as illustrative and not limiting. The scope of the present invention is indicated by the appended claims rather than by the foregoing description of the embodiment, and all changes which come within the meaning and range of equivalency of the claims are intended to be embraced therein.

For example, in the foregoing embodiment, the end portion 2*a* of the reflection sheet 2 on the side of the LEDs 7 is affixed onto the portion 8*b* (portion that is positioned below the region between the LEDs 7 and the light incidence surface 3*a* of the light guide plate 3 and inclined in the obliquely downward direction toward the light incidence surface 3*a* of the light guide plate 3) of the FPC 8. The present invention, however, is not limited thereto, and it is also possible that a predetermined coating is applied onto the portion 8*b* of the FPC 8 so as to enable the portion 8*b* of the FPC 8 to act as a reflection surface.

LIST OF REFERENCE SYMBOLS

2 Reflection sheet
2a End portion
3 Light guide plate
3a Light incidence surface
3b Light output surface
3c Back surface
3d Dot pattern
6a Frame portion (Light reflection portion)
7 LED (Light-emitting diode element)
8 FPC (Flexible printed circuit board)
8a Portion (First portion)
8b Portion (Second portion)
10 Illuminating device
20 Liquid crystal display panel

The invention claimed is:

1. An illuminating device, comprising:
a plurality of light-emitting diode elements that are arranged at a predetermined spacing from each other;
a light guide plate that has at least a light incidence surface to which the light-emitting diode elements are disposed in an opposed manner and a light output surface that is perpendicular to the light incidence surface and faces a side of an illuminated body; and
a flexible printed circuit board that includes at least a first portion disposed perpendicularly to the light incidence surface of the light guide plate, the light-emitting diode elements being mounted on the first portion,
wherein the flexible printed circuit board further includes, in addition to the first portion, a second portion positioned below a region between the light-emitting diode elements and the light incidence surface of the light guide plate, and
the second portion of the flexible printed circuit board is formed so as to be inclined in an obliquely downward direction toward the light incidence surface of the light guide plate and to reflect light from the light-emitting diode elements toward the light incidence surface of the light guide plate.

2. The illuminating device according to claim 1, further comprising:
a reflection sheet that is disposed on a side of a back surface of the light guide plate opposite to a side of the light output surface,
wherein an end portion of the reflection sheet on a side of the light-emitting diode elements extends to over the second portion of the flexible printed circuit board and is affixed onto the second portion of the flexible printed circuit board.

3. The illuminating device according to claim 1, wherein an inclination angle of the second portion with respect to the first portion of the flexible printed circuit board is set so that the light-emitting diode elements mounted on the first portion of the flexible printed circuit board are located closely to a center of the light guide plate in a thickness direction.

4. The illuminating device according to claim 1, wherein the second portion of the flexible printed circuit board is a wiring region.

5. The illuminating device according to claim 1, wherein a dot pattern is formed on a back surface of the light guide plate on a side opposite to the light output surface, and
the second portion of the flexible printed circuit board is not bonded to an end portion region of the back surface of the light guide plate on a side of the light-emitting diode elements, and a region in which the dot pattern is formed extends over an entire area of the back surface of the light guide plate.

6. The illuminating device according to claim 1, wherein a light reflection portion for reflecting light from the light-emitting diode elements toward the light incidence surface of the light guide plate is provided above the region between the light-emitting diode elements and the light incidence surface of the light guide plate.

7. A liquid crystal display device, comprising:
the illuminating device according to claim 1; and
a liquid crystal display panel that is irradiated with light from the illuminating device.

8. A liquid crystal display device, comprising:
the illuminating device according to claim 2; and
a liquid crystal display panel that is irradiated with light from the illuminating device.

9. A liquid crystal display device, comprising:
the illuminating device according to claim 3; and
a liquid crystal display panel that is irradiated with light from the illuminating device.

10. A liquid crystal display device, comprising:
the illuminating device according to claim 4; and
a liquid crystal display panel that is irradiated with light from the illuminating device.

11. A liquid crystal display device, comprising:
the illuminating device according to claim 5; and
a liquid crystal display panel that is irradiated with light from the illuminating device.

12. A liquid crystal display device, comprising:
the illuminating device according to claim 6; and
a liquid crystal display panel that is irradiated with light from the illuminating device.

* * * * *